United States Patent
Desai et al.

(10) Patent No.: US 7,663,173 B1
(45) Date of Patent: Feb. 16, 2010

(54) NON-VOLATILE MEMORY CELL WITH POLY FILLED TRENCH AS CONTROL GATE AND FULLY ISOLATED SUBSTRATE AS CHARGE STORAGE

(75) Inventors: Saurabh Desai, Fremont, CA (US); Natasha Lavrovskaya, Sunnyvale, CA (US); Yuri Mirgorodski, Sunnyvale, CA (US); Jeff Babcock, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 231 days.

(21) Appl. No.: 11/652,860

(22) Filed: Jan. 12, 2007

(51) Int. Cl.
*H01L 27/108* (2006.01)

(52) U.S. Cl. .............. 257/300; 257/347; 257/348; 257/505; 257/510; 257/E27.112

(58) Field of Classification Search .............. 257/300, 257/E27.112
See application file for complete search history.

(56) References Cited

U.S. PATENT DOCUMENTS

2002/0008273 A1* 1/2002 Kumazaki ............ 257/314
2005/0219912 A1* 10/2005 Gendrier et al. ....... 365/185.29

* cited by examiner

*Primary Examiner*—Tu-Tu V Ho
(74) *Attorney, Agent, or Firm*—Jurgen Vollrath; Vollrath & Associates

(57) ABSTRACT

In a non-volatile memory cell, charge is stored in a fully isolated substrate or floating bulk that forms a storage capacitor with a first poly strip and includes a second poly strip defining a read gate and a poly-filled trench defining a control gate.

19 Claims, 7 Drawing Sheets

NON-VOLATILE MEMORY CELL WITH POLY FILLED TRENCH AS CONTROL GATE AND FULLY ISOLATED SUBSTRATE AS CHARGE STORAGE

FIELD OF THE INVENTION

The invention relates to a non-volatile memory (NVM) cell. In particular it relates to a NVM that makes use of a single polysilicon layer.

BACKGROUND OF THE INVENTION

FIG. 1 shows a prior art electrically erasable PROM (EE-PROM) 100. It includes an n+ drain 102 and n+ source 104 formed in a p-well 106 and separated by a channel region 108. A floating gate 110 is formed over the channel region 108 and separated from the substrate 106 by a dielectric 112 in the form of a gate oxide. A control gate 114, separated from the floating gate 110 by an insulating layer 116, is formed over the floating gate 110. The floating gate 110 acts as the charge storage region for the memory device and is programmed by applying a voltage to the drain 102 and pulsing the control gate 114. This creates a high conductivity region in the channel region 108. High energy electrons (hot electrons) are accelerated across the channel region 108 and occasionally collide with lattice or dopant atoms to generate additional electron-hole pairs by impact ionization. The resultant scattered electrons occasionally have sufficient energy to bridge the gap of the dielectric 112 to the floating gate 110, being helped across by the voltage on the control gate. While programming of the cells involved hot electrons colliding with lattice and dopant atoms, erasing involves Fowler-Nordheim tunneling. In order to achieve this tunneling effect, a high electric field is established across the gate oxide 112 between the floating gate 110 and the channel 108. The effect is that during erasing of the memory cell, electrons are removed from the floating gate 110 by pulsing the drain 102 while holding the control gate 114 at ground or negative potential. The source 104 is permitted to float during erasing. The EEPROM thus has the advantage of allowing individual memory cells to be erased electronically.

FIG. 2 shows an electrically erasable PROM (EEPROM) 200, which differs from the EEPROM in FIG. 1 in that it includes a thin tunnel dielectric 202 between the drain 204 and the floating gate 206. This allows both programming and erasing by Fowler-Nordheim tunneling, which is achieved by providing a potential difference across the drain 204 and control gate 208 of the order of 20V. During programming, electrons are added to the floating gate 206 by holding the drain at ground level and pulsing the control gate 208 at 20V for about 10 ms.

In contrast, during erasing of the memory cell, electrons are removed from the floating gate 206 by pulsing the drain 204 while holding the control gate 208 at ground potential. The source 210 is permitted to float during programming and erasing. As mentioned above, the EEPROM has the advantage of allowing individual memory cells to be erased electronically. In fact, in practice all of the memory cells in an array are typically erased and thereafter select memory cells are programmed.

Yet another type of memory cell, known as the Frohmann-Bentchkowsky EPROM 300, is shown in FIG. 3 and involves only a single poly layer defining a gate 302 separated from a channel region 304 by a gate oxide layer 306. An insulating layer 310 also covers the gate 302 to completely encapsulate the gate 302, thereby defining a floating gate that acts as the charge accumulation region. A p+ drain 312 and p+ source 314 are formed in an n-well 320 or n-substrate on either side of the channel region 304 and programming of the memory cell occurs by providing a lower voltage to the drain 312 compared to the source 314 and well 320. In particular, the well 320 can be held at ground level with the source 314 at ground level, while the drain 312 is held at a negative voltage. Alternatively the drain 312 can be held at ground while the well 320 is provided with a positive voltage and the source 314 is held at the positive voltage. The effect is a high electric field across the channel region 304 which causes hot electrons to be accelerated across the channel and occasionally to generate electron hole pairs by impact ionization. Some of the electrons generated by the impact ionization bridge the gap to the floating gate 302 to establish a negative charge in the gate. However, during the erasing process, since there is no control gate, there is no way to remove the charge from the floating gate. Thus the only way to erase a memory array made of memory cells of this nature is to eradiate them with UV radiation thereby erasing all of the memory cells in the array. Thus while this structure has the advantage of making use of only a single poly layer, it suffers from the disadvantage that individual memory cells in an array cannot be separately erased and the erasing is not electrical.

In order to address this problem, a single poly EEPROM was developed as shown in FIG. 4. This prior art EEPROM includes a first PMOS involving a p+ drain 400 and a p+ source 402 in a first n-well 404 with a floating poly gate 406 formed above a channel 408 between the drain 400 and source 402. The EEPROM further includes a second PMOS comprising a p+ drain 410 and a p+ source 412 in a second n-well 414, with a floating poly 416 formed over a channel region 418 between the drain 410 and p+ source 412. By including a second capacitor as defined by the second poly 416, spaced from the channel region 418 by an oxide layer 420, the cell of FIG. 4 provides for a control gate that allows the storage capacitor (as defined by the poly 406 spaced from the channel 408 by an oxide layer) to be electrically erased. It will however be appreciated that this structure has the drawback that it requires two PMOS devices. It therefore requires a considerable amount of space as defined by the well spacing between the two PMOS devices.

The applicant has therefore developed a new structure, which is described in concurrently filed patent application entitled "NON-VOLATILE MEMORY CELL WITH FULLY ISOLATED SUBSTRATE AS CHARGE STORAGE". In this structure, which is shown in plan view in FIG. 5 and folded out cross-section in FIG. 6, a single poly layer is used to form a control gate (CG) 512, erase/program gate (E/P G) 510 and read gate (RG) 540 formed over an isolated substrate or floating bulk (FB) 502 (that is isolated from a substrate 530 below by a buried oxide 531, and is isolated along its sides by trench oxide (deep or shallow trench) 506, and from the poly strips above by gate oxide 508. The RG 540 provides an extension 542 that extends over a second substrate region that is isolated from the FB. A drain region 520 and a source region 522 are formed in the second substrate region 532 and form a channel region 524 between them to define a read transistor 518 with the extension 542 serving as transistor poly gate. The detailed description of the structure 500 and its operation is given in the above patent application entitled "NON-VOLATILE MEMORY CELL WITH FULLY ISOLATED SUBSTRATE AS CHARGE STORAGE", which is included herein in its entirety by reference. The one drawback that exists in the structure 500 is that it still uses up a considerably amount of space due to the need for a large CG 512 to provide the necessary capacitive coupling with the FB 502.

Thus it will be appreciated that each of the prior art devices suffers from certain disadvantages. In the EPROM cell of FIG. 3 the capacitor is defined by a floating gate separated from a well by a gate oxide, however since there is no control gate, the erasing process requires UV radiation. In contrast, all of the electrically erasable memory cells involve a control transistor and a capacitor for charge storage. For instance, in the EEPROM of FIG. 1 and EEPROM of FIG. 2 the capacitor is formed by the floating gate separated by the gate oxide from the well, and a control gate is used to control the floating gate voltage. These EEPROM devices however also suffer from disadvantages, in that the floating gate and control gate are formed from two separate poly layers. In the case of the EEPROMs of FIG. 4 and FIGS. 5 and 6 the above problem is addressed in that both these structures make use of only a single poly. However, in the case of the FIG. 4 embodiment it requires two n-wells and therefore uses up a lot of space as determined by the well-to-well spacing, while in the FIGS. 5 and 6 embodiment the large control gate consumes a considerable amount of space.

The present invention seeks to improve the memory cell density of the structures of the prior art and of the concurrently filed application shown in FIGS. 5 and 6, while maintaining the advantage of a single poly structure.

SUMMARY OF THE INVENTION

According to the invention, there is provided an NVM cell, comprising a fully isolated substrate, a drain region and a source region formed in a substrate material that is isolated from the fully isolated substrate, and a first polysilicon (poly) strip formed on top of the fully isolated substrate, a second polysilicon strips extending across to the substrate that is isolated from the fully isolated substrate, wherein the fully isolated substrate is laterally isolated by polisilicon-filled trenches. The fully isolated substrate may be isolated over its top by a gate oxide, and along its bottom by a buried oxide. Preferably, the first poly strip formed on top of the fully isolated substrate defines a gate for erasing and programming (E/P G), and the second poly strip defines a read gate (RG). The portion of the second polysilicon strip that extends across to the substrate that is isolated from the fully isolated substrate may extend over a channel region between the drain and source regions, thereby defining a polygate of a MOS transistor. Preferably the RG is larger than the E/P G, and the portion of the read gate over the fully isolated substrate is larger than the portion of the read gate over the channel of the transistor. Typically, the polisilicon-filled trenches define a control gate (CG).

Further, according to the invention, there is provided an NVM cell, comprising a floating bulk (FB), a drain region and a source region formed in a substrate material that is isolated from the FB, the drain and source regions being separated by a channel over which a poly gate is formed to define a transistor, a first poly strip formed on the FB defining a programming and erase gate (E/P G) to form a storage capacitor with the FB, a second poly strip formed on the FB defining a read gate (RG), which is electrically connected to the poly gate of the transistor, and a poly-filled trench formed between the FB and the substrate material that is isolated from the FB, the poly-filled trench defining a control gate (CG) for the NVM. The poly gate of the transistor may be formed from an extension of the second poly strip, wherein the portion of the second poly strip defining the transistor poly gate may be smaller than the portion extending over the FB.

Still further, according to the invention, there is provided an NVM cell comprising a fully isolated substrate, a poly-filled trench defining lateral isolation for the fully isolated substrate and forming a control gate, a first poly strip defining an erase/program gate formed on top of the fully isolated substrate and spaced from the fully isolated substrate by a gate oxide, and a second poly strip defining a read gate formed on top of the fully isolated substrate and spaced from the fully isolated substrate by a gate oxide, the read gate being larger than the erase/program gate. A portion of the read gate may extend over a channel region between two n+ or two p+ regions defining a sense transistor, the two n+ or two p+ regions being formed in a substrate that is isolated from the fully isolated substrate. The portion of the read gate over the channel region of the transistor may be of similar size to the erase/program gate. The two n+ or two p+ regions typically define a source region and a drain region of the sense transistor and the substrate in which they are formed is preferably isolated from the fully isolated substrate. The fully isolated substrate may comprise a substrate region that is isolated along its sides by the poly-filled trench, over its top by a gate oxide, and along its bottom by a buried oxide.

Still further, according to the invention, there is provided a method of operating an NVM cell of the invention comprising programming the NVM cell by providing a high voltage to the CG and a lower voltage to the E/P G, the potential difference between the CG and the E/P G being sufficient to cause electrons to pass from the E/P G to the FB by Fowler-Nordheim tunneling. Typically the lower voltage is ground potential. Erasing the NVM may comprise applying a high voltage to the E/P G while maintaining the CG at a lower potential the potential difference between the CG and the E/P G being sufficient to cause electrons to pass from the FB to the programming gate by Fowler-Nordheim tunneling. Reading the NVM cell may comprise applying a voltage to the drain region and monitoring the drain current of the transistor, the read gate being connected to the FB or being left floating.

DETAILED DESCRIPTION OF THE INVENTION

Figure 6:
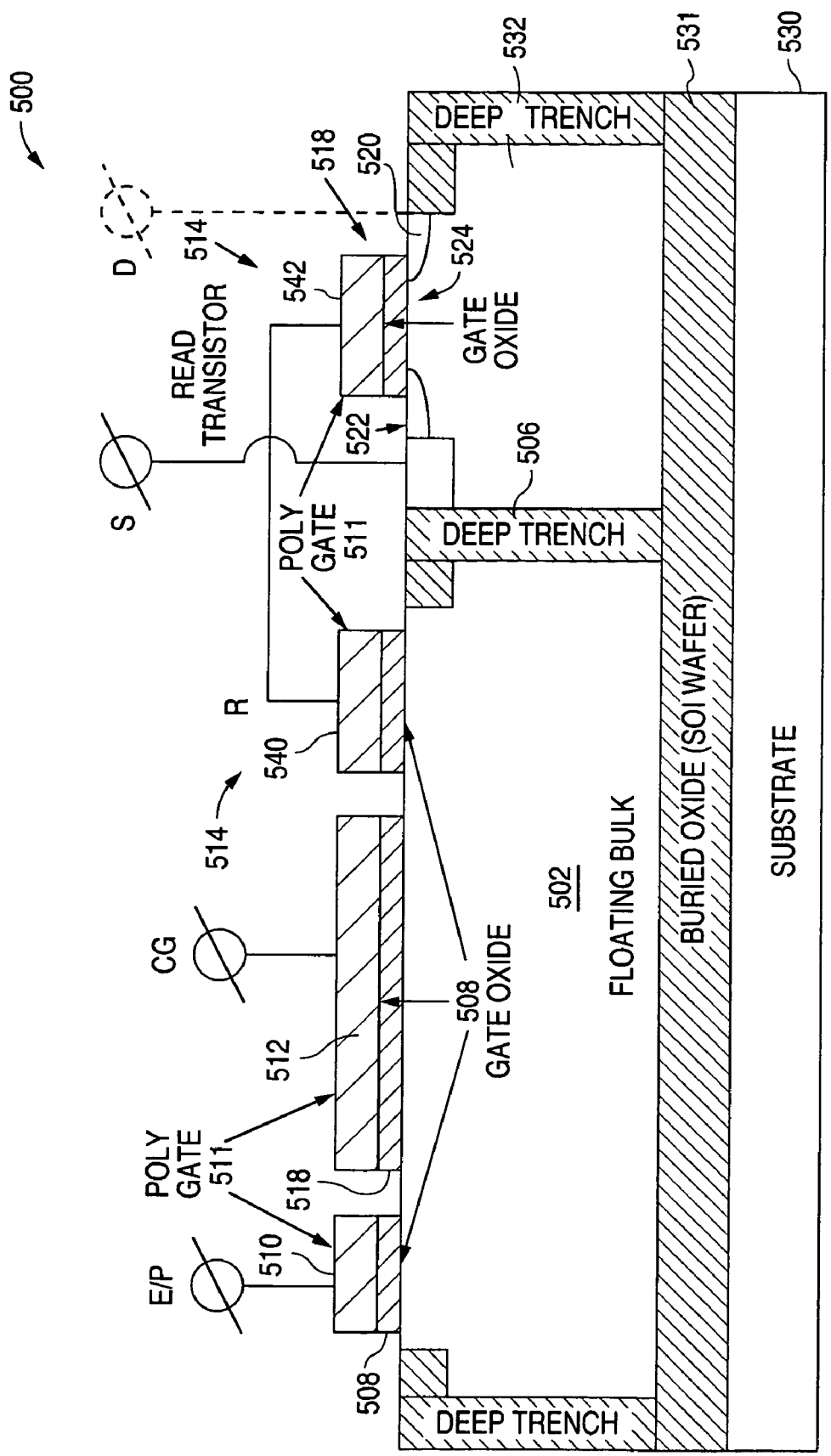
FIG. 6 is a sectional side view of the cell of FIG. 5 but with the read transistor shown laterally arranged to extend in line with the storage portion of the NVM.
Figure 7:
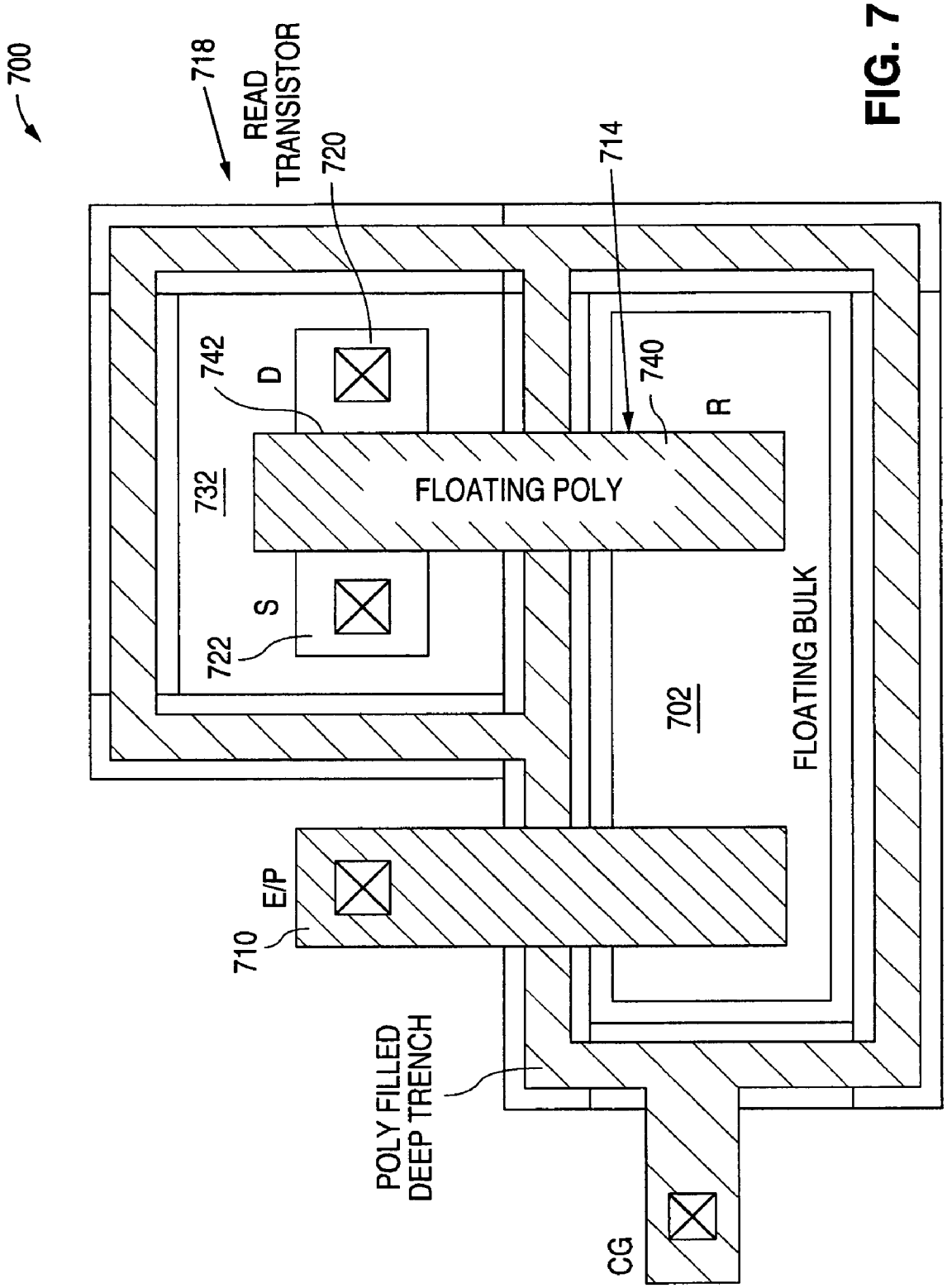
FIG. 7 is a plan view of one embodiment of a single poly NVM cell of the invention.
Figure 8:
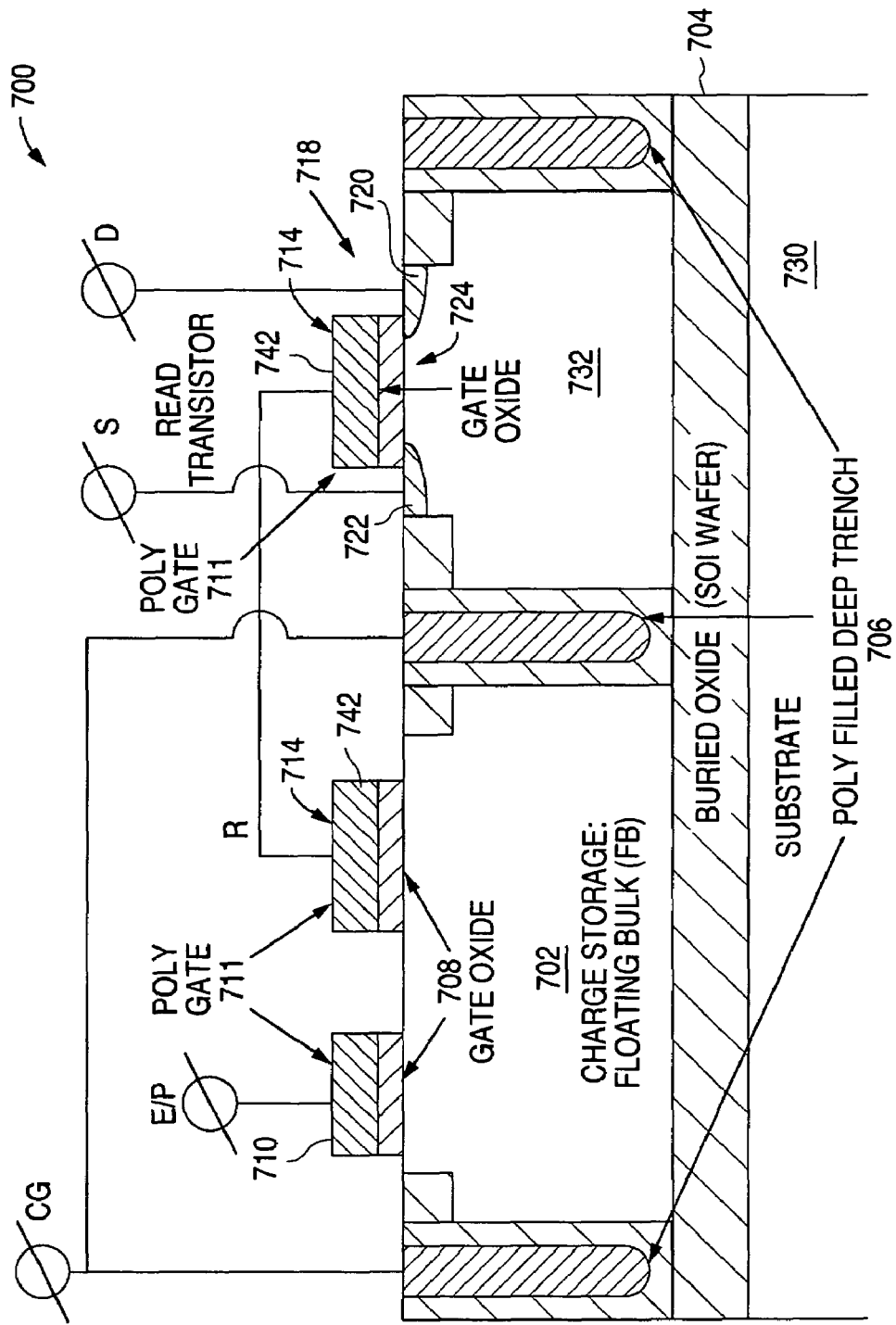
FIG. 8 is a sectional side view of the cell of FIG. 7 but with the read transistor shown laterally arranged to extend in line with the storage portion of the NVM.

One embodiment of the present invention is shown in FIGS. 7 and 8, which show a plan view and an aligned sectional side view, respectively, of one embodiment of a non-volatile memory (NVM) cell in accordance with the invention. As in the case of the concurrently filed application structure shown in FIGS. 5 and 6, the NVM of the invention makes use of a storage capacitor defined by a fully isolated substrate region and a polisilicon region formed above the fully isolated substrate region and isolated from the fully isolated substrate region by a gate oxide. For purposes of this application the term fully isolated substrate region will be used interchangeably with the term floating bulk (FB).

The NVM 700 of FIGS. 7 and 8 is formed as part of a Silicon over Isolator (SOI) process in which a portion of the substrate 702 is isolated by a buried oxide 704. In accordance with the invention the substrate 702 is fully isolated from the substrate 730 below (shown in FIG. 8) and the substrate region 732 extending perpendicularly to the substrate 702 (as shown in FIG. 7). It will be appreciated that the side view shown in FIG. 8 is, for convenience, represented as being linear in which the substrate region 732 is aligned with the fully isolated substrate 702. The isolated substrate is laterally isolated by a deep trench 706 along the sides, and over the top by a gate oxide 708. Instead of a deep trench isolation 706 a shallow trench could be used to isolate the substrate 702. (However, as is discussed in greater detail below, the trench is filled with polisilicon and serves also as the control gate of the NVM cell, and in the case of a shallow trench the limited capacitive coupling provided by the trench poly will have to be considered.) Since the substrate 702 is fully isolated it is also referred to as a floating bulk (FB) in this application.

The NVM cell 700 includes a storage capacitor defined by a polysilicon (poly) strip 710 formed as part of a single poly layer 711. The poly layer 711 is formed on top of the gate oxide 708 thereby spacing it from the fully isolated substrate 702. Thus by providing a potential difference across the poly strip 710 (which defines the erase/program gate (E/P G)) and the floating bulk (FB) 702 electrons can be caused to move to or from the FB by Fowler-Nordheim tunneling as is described in greater detail below. As is discussed in greater detail below, the creation of the potential difference over the E/P G and FB includes controlling the voltage of the FB by capacitive coupling.

As mentioned above, the poly trench 706 acts as a control gate (CG) and controls the potential of the FB by electrically coupling with the FB 702.

The NVM cell 700 further includes a read transistor 718 defined by a p+ drain region 720 and p+ source region 722 separated from each other by a channel 724. The p+ drain 720 and p+ source 722 are both formed in the substrate 732, which is isolated from the FB 702 as discussed above.

As shown in FIGS. 7 and 6 a poly strip 714 is formed from the poly layer 711 to define a read (R) gate 740 for the NVM cell as well as provide an extension to a channel region between the drain region 720 and source region 722 to form the transistor gate 742 of the sense transistor 718. Since the transistor gate 742 simply forms an extension of the R gate (shown in FIG. 8 as an electrical connection) any voltage change on the R gate 740 will appear as a voltage change on the transistor gate 742 thereby allowing the voltage on the R gate 740 to be monitored as is discussed in greater detail below.

It will be appreciated from FIGS. 7 and 8 that capacitive coupling between the trench poly 706 defining the CG occurs laterally. Therefore the deeper the trench the greater the capacitive coupling with the FB. Thus voltage changes to the trench poly CG 706 are transferred to the FB 702 and serve to erase or program the FB 702 depending on the relative voltage of the E/P G.

The R gate 740 is in turn larger than the poly strip 710 forming the E/P G to provide for better coupling with the FB for sensing by the sensing transistor through the transistor gate 742. In this embodiment the portion of the poly strip 714 forming the transistor gate 742 is substantially the same size as the portion over the FB defining the R gate. In another embodiment the portion over the channel 724, forming the transistor gate 742 is smaller than the portion over the FB and is formed to be substantially the same size as the poly strip 710. The R gate 740 in this embodiment is left floating so that the voltage on the R gate depends on the coupling ratio between FB and R gate, however in another embodiment the R gate is connected to the FB so that the voltage on the R gate is the same as that of the FB.

During the programming of the memory cell a positive voltage of about 10 V (depending on the gate oxide 708 thickness) is applied to the trench poly CG 706. All other nodes are grounded. Thus the electrical coupling between the CG 706 and the FB 702 provides a high voltage on the FB 702 sufficient to allow electrons to tunnel from the E/P G 710 to the FB 702 by Fowler-Nordheim (F-N) tunneling. This makes the potential of the FB 702 more negative.

Figure 1:
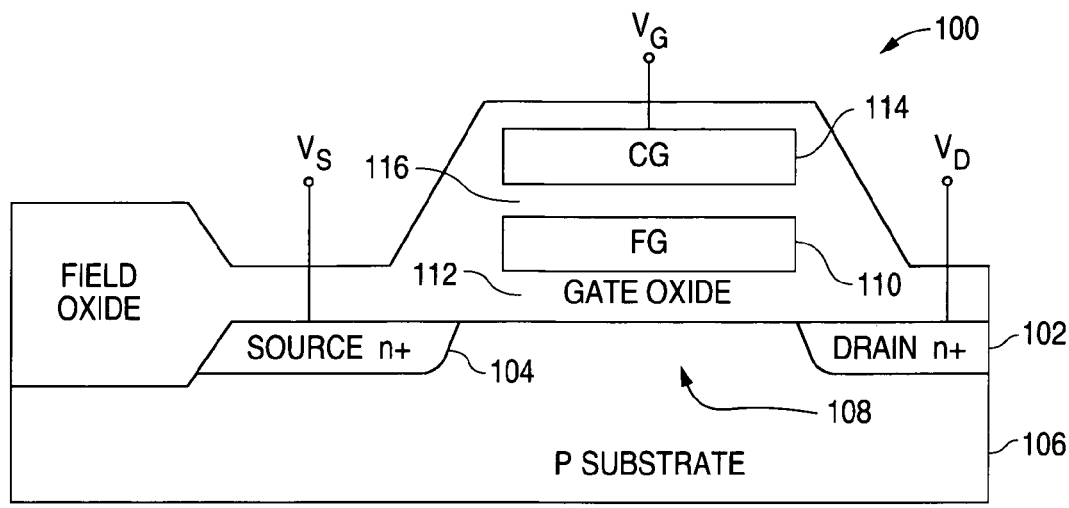
FIG. 1 is a sectional side view of a prior art double poly EEPROM.
Figure 2:
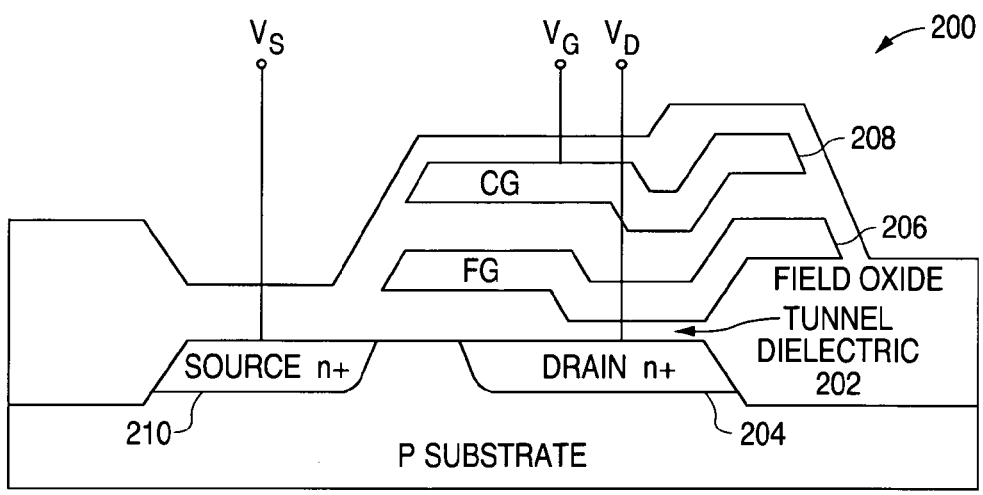
FIG. 2 is a sectional side view of another prior art double poly EEPROM.
Figure 3:
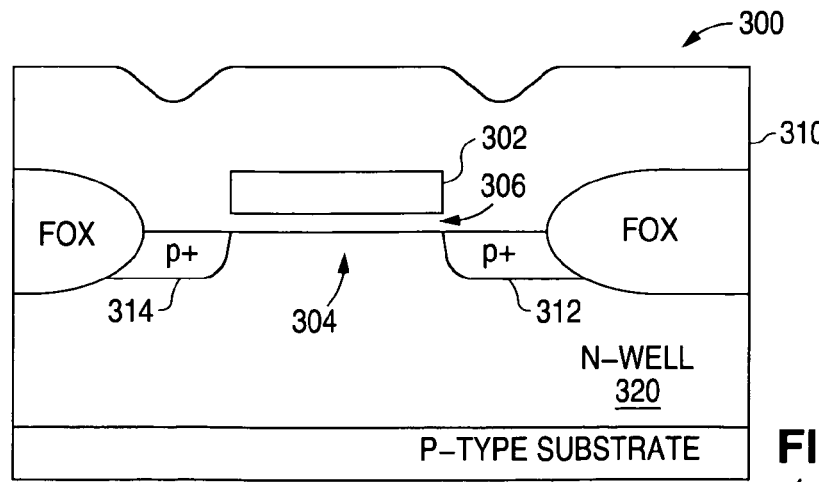
FIG. 3 is a sectional side view of a single poly EPROM memory cell.
Figure 4:
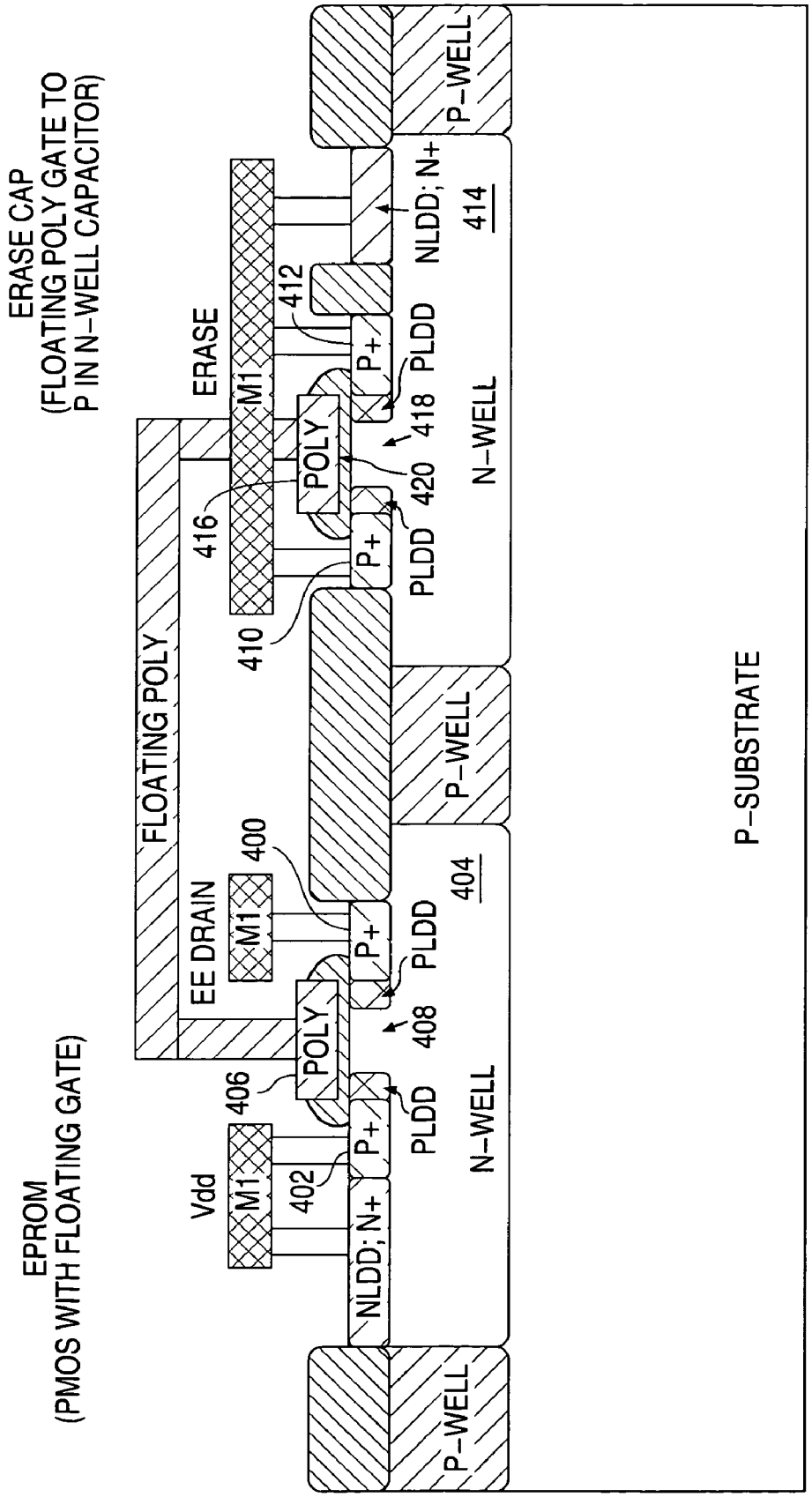
FIG. 4 is a side view of a prior art single poly EEPROM cell.
Figure 5:
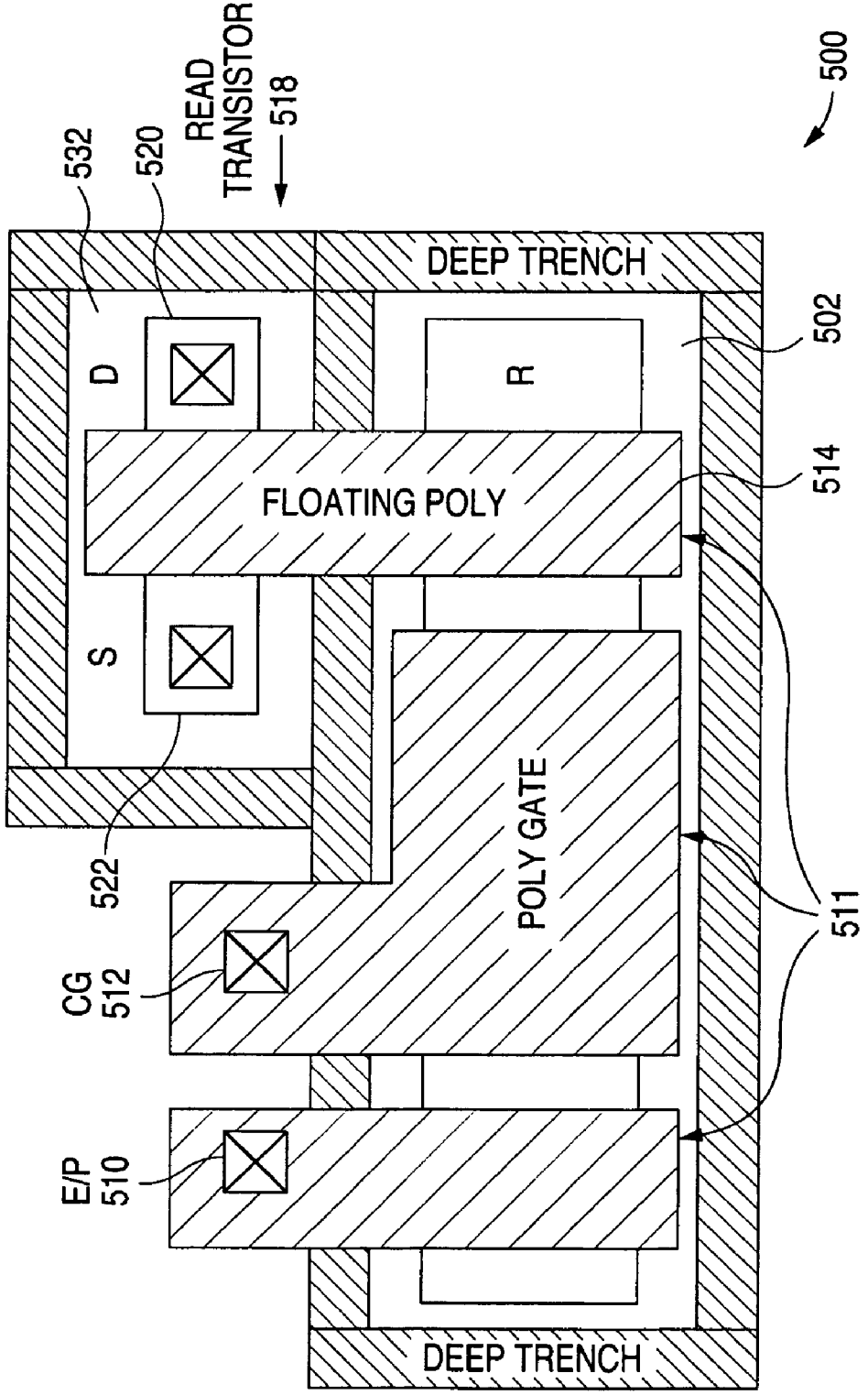
FIG. 5 is a plan view of a single poly NVM cell of a concurrently filed application of the applicant.
Figure 9:
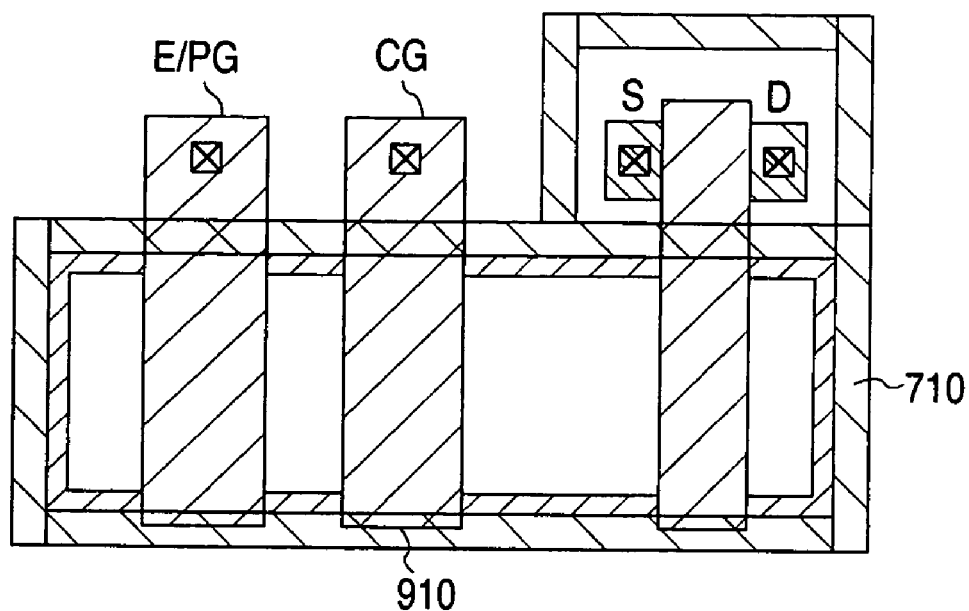
FIG. 9 is a plan view of another embodiment of a single poly NVM cell of the invention.

In the case of a shallow trench poly the necessary capacitive coupling with the FB can be achieved by adding a small separate CG 910 formed from the poly layer 711 as shown in FIG. 9, (similar to the poly strip 510 of FIGS. 5 and 6 but smaller due to the capacitive coupling already provided by the trench poly 706. In such an embodiment the trench poly CG 711 and the CG 910 are electrically connected.

Figure 10:
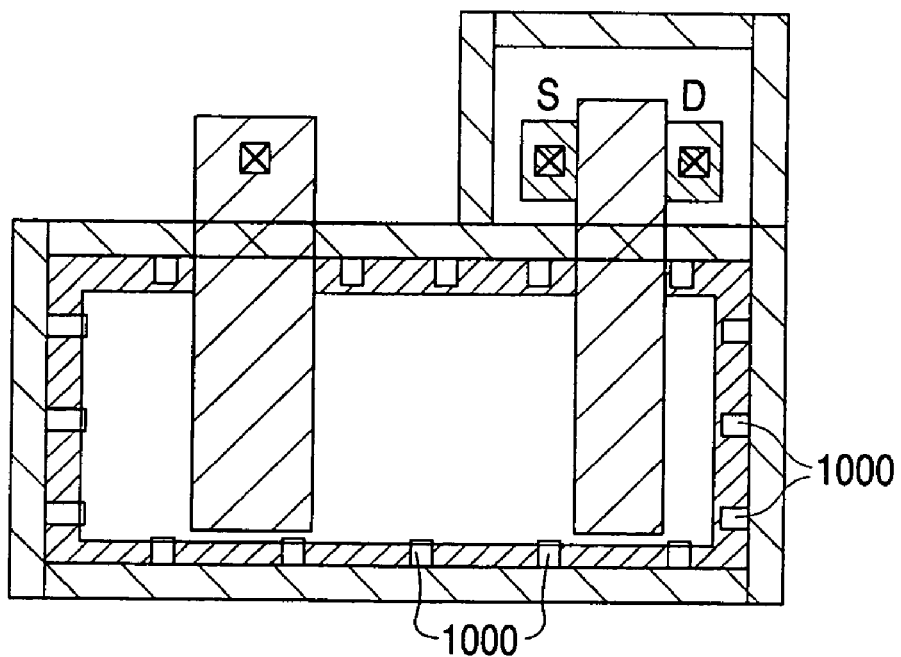
FIG. 10 is a plan view of yet another embodiment of a single poly NVM cell of the invention.

In yet another embodiment the shallow trench poly is formed in a wavy or zig-zag format or is provided with tines 1000 as shown in FIG. 10 to provide a larger capacitive coupling area.

Referring again to the embodiment of FIGS. 7 and 8, during erasing of the memory cell a positive voltage of about 10 V (again depending on the gate oxide 708 thickness) is applied to the E/P G 710, while all other nodes are grounded. Due to coupling between the control gate (CG) 706 and the FB 702, this results in a low voltage on the FB 702. As a result of F-N tunneling electrons tunnel from the FB 702 to the E/P G, leaving the FB potential more positive.

During reading of the NVM cell 700 a read voltage of 1-3 V is applied to the drain 720 and the drain current is monitored. The FB can either be connected to the R gate thereby ensuring that the R gate 724 tracks the FB voltage, or the R gate can be left floating, in which case the voltage on the R gate remains a function of the FB voltage depending on the coupling ratio of the upper capacitor plate as defined by the poly strip 740 and the lower capacitor plate as defined by the floating bulk 702. Since the drain current depends on the voltage on the R gate, it is possible to determine the voltage on the FB and thus the amount of positive or negative charge on the FB 702.

While the above embodiment made use of a PMOS transistor 718 the NVM cell of the invention can instead be implemented using an NMOS transistor.

The benefit of the present invention is that it provides a smaller size NVM cell. Instead of the size being defined by the well size as in prior art NVM cells that use only a single poly, the NVM cell size in the present invention is defined by the poly-to-poly space which can be significantly smaller.

The NVM cell of the invention also has the advantage of decoupling the E/P gate poly 710 from the read transistor which is expected to improve data retention under bias conditions.

While the present invention has been described with reference to specific embodiment, it will be appreciated that the invention is not so limited and can instead be implemented in other ways without departing from the scope of the invention as defined by the claims.

What is claimed is:

1. An NVM cell, comprising
   a fully isolated substrate,
   a drain region and a source region formed in a substrate material that is isolated from the fully isolated substrate,
   a first polysilicon (poly) strip formed on top of the fully isolated substrate, and
   a second polysilicon strip extending across to the substrate that is isolated from the fully isolated substrate, wherein the fully isolated substrate is laterally isolated by polisilicon-filled trenches, the first poly strip formed on top of the fully isolated substrate defines a gate for erasing and programming (E/P G), and the second poly strip defines a read gate (RG).

2. An NVM cell of claim 1, wherein the fully isolated substrate is isolated over its top by a gate oxide, and along its bottom by a buried oxide.

3. An NVM cell of claim 1, wherein the portion of the second polysilicon strip that extends across to the substrate that is isolated from the fully isolated substrate extends over a channel region between the drain and source regions, thereby defining a polygate of a MOS transistor.

4. An NVM of claim 3, wherein the RG is larger than the E/P G.

5. An NVM cell of claim 4, wherein the portion of the read gate over the fully isolated substrate is larger than the portion of the read gate over the channel of the transistor.

6. An NVM of claim 1, wherein the polisilicon-filled trenches define a control gate (CG).

7. An NVM cell, comprising
   a floating bulk (FB),
   a drain region and a source region formed in a substrate material that is isolated from the FB, the drain and source regions being separated by a channel over which a poly gate is formed to define a transistor,
   a first poly strip formed on the FB defining a programming and erase gate (EP G) to form a storage capacitor with the FB,
   a second poly strip formed on the FB defining a read gate (RG), which is electrically connected to the poly gate of the transistor, and
   a poly-filled trench formed between the FB and the substrate material that is isolated from the FB, the poly-filled trench defining a control gate (CG) for the NVM.

8. An NVM cell of claim 7, wherein the poly gate of the transistor is formed from an extension of the second poly strip.

9. An NVM cell of claim 8, wherein the portion of the second poly strip defining the transistor poly gate is smaller than the portion extending over the FB.

10. A method of operating an NVM cell of claim 7, comprising
    programming the NVM cell by providing a high voltage to the CG and a lower voltage to the E/P G, the potential difference between the CG and the E/P G being sufficient to cause electrons to pass from the E/P G to the FB by Fowler-Nordheim tunneling.

11. A method of claim 10, wherein the lower voltage is ground potential.

12. A method of claim 10, further comprising erasing the NVM by applying a high voltage to the E/P G while maintaining the CG at a lower potential the potential difference between the CG and the E/P G being sufficient to cause electrons to pass from the FB to the programming gate by Fowler-Nordheim tunneling.

13. A method of claim 10, further comprising reading the NVM cell by applying a voltage to the drain region and monitoring the drain current of the transistor.

14. A method of claim 13, wherein the read gate is connected to the FB or is left floating.

15. An NVM cell comprising
    a fully isolated substrate,
    a poly-filled trench defining lateral isolation for the fully isolated substrate and forming a control gate,
    a first poly strip defining an erase/program gate formed on top of the fully isolated substrate and spaced from the fully isolated substrate by a gate oxide, and
    second poly strip defining a read gate formed on top of the fully isolated substrate and spaced from the fully isolated substrate by a gate oxide, the read gate being larger than the erase/program gate.

16. An NVM cell of claim 15, wherein a portion of the read gate extends over a channel region between two n+ or two p+ regions defining a sense transistor, the two n+ or two p+ regions being formed in a substrate that is isolated from the fully isolated substrate.

17. An NVM cell of claim 16, wherein the portion of the read gate over the channel region of the transistor is of similar size to the erase/program gate.

18. An NVM cell of claim 16, wherein the two n+ or two p+ regions define a source region and a drain region of the sense transistor and the substrate in which they are formed is isolated from the fully isolated substrate.

19. An NVM cell of claim 18, wherein the fully isolated substrate comprises a substrate region that is isolated along its sides by the poly-filled trench, over its top by a gate oxide, and along its bottom by a buried oxide.

* * * * *